United States Patent [19]

Nishiura

[11] Patent Number: 4,868,623
[45] Date of Patent: Sep. 19, 1989

[54] IMAGE SENSING DEVICE

[75] Inventor: Masaharu Nishiura, Yokosuka, Japan

[73] Assignee: Fuji Electric Co., Ltd., Kawasaki, Japan

[21] Appl. No.: 161,223

[22] Filed: Feb. 17, 1988

Related U.S. Application Data

[63] Continuation of Ser. No. 801,933, Nov. 26, 1985, abandoned.

[30] Foreign Application Priority Data

Nov. 27, 1984 [JP] Japan .................. 59-249995

[51] Int. Cl.4 ............................ H01L 27/14
[52] U.S. Cl. ............................ 357/32; 357/2; 357/30; 357/58; 357/59
[58] Field of Search .............. 357/2, 30, 32, 58, 59

[56] References Cited

U.S. PATENT DOCUMENTS 4,581,620 4/1986 Yamazaki et al. .................. 357/30

Primary Examiner—Edward J. Wojciechowicz
Attorney, Agent, or Firm—Brumbaugh, Graves, Donohue & Raymond

[57] ABSTRACT

An amorphous silicon thin-film p-i-n photodiode array image sensor structure is provided which avoids excessive leakage currents caused by contamination of the side-walls of anisotropically etched amorphous silicon film with conducting materials, such as metal or metal silicide, during fabrication. The present image sensor structure includes a deposited SiO2 layer that separates all exposed silicon side-walls from directly underlying conductors.

9 Claims, 2 Drawing Sheets

A—A

IMAGE SENSING DEVICE

This application is a continuation of application Ser. No. 801,933, filed on Nov. 16, 1985, now abandoned.

BACKGROUND OF THE INVENTION

The present invention relates to image sensing devices and, more particularly, to image sensing devices that comprise an array of thin-film semiconductor photodiodes.

In the development of high-speed, high-resolution facsimile equipment, it has become necessary to provide image sensors comprising large, high density arrays of photodetectors which are capable of fast response and high sensitivity to small changes in light intensity. A typical scanning arrangement used in facsimile equipment is illustrated in FIG. 1. With reference to FIG. 1, a manuscript 1 moves in a transverse direction relative to a linear image sensor 2 comprising a linear array of regularly spaced photodetectors 3, which extend across the width of the manuscript 1. The image of one line of the manuscript at a time is focused onto the photodetector array 3 by a Selfoclens 5. The manuscript is illuminated by two linear arrays of light emitting diodes 4 situated on each side of the Selfoclens 5.

In order to meet the requirements of highspeed, high-resolution facsimile equipment currently being developed, it is generally desirable for the photodetectors of the linear array to have a pitch of approximately 8 per mm or 16 per mm, depending upon the expected size of the patterns in the manuscript to be scanned. The active area of each photodetector should be approximately 100 $\mu$m $\times$ 100 $\mu$m for the larger pitch and 50 $\mu$m $\times$ 50 $\mu$m for the smaller pitch. Furthermore, the response time of the photodetectors should be such that an A4 or B4 size manuscript can be scanned at the rate of one line in 4 msec or less.

Formerly, image sensors for facsimile equipment have been constructed with linear arrays of charge-coupled devices (CCD's); however, recently there have been developed image sensors constructed with linear arrays of thin-film semiconductor p-i-n photodiodes. The latter construction provides the advantages of allowing larger arrays to be fabricated with improved performance and lower manufacturing cost.

A known structure for a thin-film, p-i-n photodiode array image sensor is illustrated in FIGS. 2 and 3. Referring to FIGS. 2 and 3, the image sensor 20 comprises a plurality of regularly spaced p-i-n photodiodes 51 disposed in a row. The photodiodes 51 are fabricated by first forming a layer 2 of a transparent conducting material, such as indium tin oxide or $SnO_2$, on a major surface of a glass substrate 1. The transparent conducting layer 2, which has a thickness in the range of several hundred to several thousand angstroms, may be formed by conventional electron beam evaporation, sputtering or chemical vapor deposition (CVD) techniques. Once formed, the layer is patterned into a wide strip by conventional photolithographic and etching techniques.

Following the formation of transparent conducting layer region 2, an amorphous silicon layer 3 (shown after patterning) of approximately 1 $\mu$m in thickness is formed by glow discharge decomposition of $SiH_4$ gas at a relatively low temperature in a reaction chamber containing the substrate 1. During the formation of the amorphous silicon layer 3, appropriate impurities, such as diborane and phosphine, are introduced into the reactor chamber to produce a layer-like p-type impurity zone 31 of approximately 100 Å in thickness adjacent to the transparent conducting layer 2 and a layer-like n-type impurity zone 32 of approximately 500 Å in thickness adjacent the upper surface of the amorphous silicon layer 3. The region of the amorphous silicon layer between the p-type and n-type impurity zones 31 and 32 is undoped (i.e., intrinsic). In some instances, the layer-like p-type impurity zone 31 is formed by depositing a layer of amorphous SiC:H over the transparent conducting layer before the deposition of the amorphous silicon layer.

After deposition of the amorphous silicon layer, a layer of an appropriate metal 4 (shown after patterning), such as aluminum, is deposited by conventional electron beam evaporation to a thickness of approximately 1 $\mu$m covering the amorphous silicon layer. The metal layer is then patterned by conventional photolithographic and etching techniques to form square electrode regions 41 and strip-like connecting regions 42. Thereafter, the amorphous silicon layer is subjected to an anisotropic etch using a plasma generated in $CF_4$ with relatively low frequency RF fields at a relatively low pressure. Owing to the high selectivity of such an etch, the patterned aluminum layer 4 is used as the etch mask to form the separate amorphous polysilicon layers 3 having the same shape as the aluminum layers 4.

The image sensor 20 fabricated in the foregoing manner comprises a linear array of p-i-n photodiodes 51 having a transparent conductor 2 that serves as a common anode electrode, aluminum electrode regions 41 that serve as separate cathode electrodes for the individual photodiodes and amorphous silicon layers 3 between the anode and cathode electrode regions 2 and 41. Each of the amorphous silicon layers 3 has a p-type zone 31 in ohmic contact with the anode electrode 2, an n-type zone making ohmic contact with a respective one of the cathode electrodes 41 and an intrinsic zone between the p-type and n-type zones 31 and 32. During operation, the photodiodes 51 are appropriately reverse biased and light is incident on the amorphous silicon regions of each photodiode through the glass substrate and the transparent common anode electrode 2. Photodetection signals produced by the photodiodes 51 are provided through respective ones of the strip-like aluminum connecting regions 42, which serve to conduct such signals to signal processing circuitry (not shown).

Although the above-described known image sensor structure has the advantages of high performance, high packing density and requiring relatively few processing steps for its fabrication, it has the problem of low manufacturing yield, owing to the amorphous silicon region 3 having exposed side surfaces 8 at the edges thereof which extend between the anode and cathode electrodes 2 and 41. During processing of the photodiode array 20, such exposed side surfaces 8 are subject to being contaminated with aluminum or aluminum-silicide, which tends to create leakage paths between the anode and cathode electrodes 2 and 4 of the photodiodes 51. If the leakage current of any one of the photodiodes 51 of the sensor 20 exceeds a specified maximum value, the entire sensor must be rejected and the manufacturing yield of the sensor is thus reduced.

Accordingly, a need exists for an improved thin-film p-i-n photodiode array image sensor structure which avoids the above-described leakage-current yield loss mechanism that exists in the prior art structure.

SUMMARY OF THE INVENTION

The foregoing and other problems of the prior art are overcome, in accordance with the present invention, by a thin-film photodiode array image sensor structure comprising a plurality of separate transparent conducting layers formed on a major surface of a transparent substrate, each of the transparent conducting layers having an electrode region and a strip-like connecting region extending from one side of the electrode region. The image sensor further comprises a plurality of separate semiconductor layers, each being in contact with the electrode region of a respective one of the transparent conducting layers and having a p-type zone adjacent to the transparent conducting layer, an n-type zone adjacent to an upper surface of the semiconductor layer and an intrinsic zone between the p-type and n-type zones. Additionally, the image sensor comprises a metal layer in contact with the upper surface of each one of semiconductor layers, wherein each such semiconductor layer has at least one exposed edge overlying the respective one of the transparent conducting layers and there is included an insulating layer interposed between each such exposed edge of each semiconductor layer and the respective one of the transparent conducting layers.

According to one embodiment of the invention, the insulating layer extends over at least the electrode regions of all the transparent conducting layers and has a plurality of apertures, each framing the electrode region of a respective one of the transparent conducting layers and exposing a portion thereof, and each semiconductor layer is formed to cover a respective one of the apertures of the insulating layer and to overlap the edges of the aperture.

According to another embodiment of the invention, the insulating layer covers at least a portion of the connecting region adjacent to the electrode region of each transparent conducting layer and overlaps an edge of the electrode region on the side from which the connecting region extends. Furthermore, each semiconductor layer covers the electrode region of the respective one of the transparent conducting layers and overlaps the insulating layer and edges of the electrode region not overlapped by the insulating layer. Preferably, the transparent substrate comprises glass; the transparent conducting layers comprise indium tin oxide or $SnO_2$; the semiconductor layers comprise amorphous silicon; the metal layer comprises aluminum; and the insulating layer comprises $SiO_2$, $Si_3N_4$ or SiC:H.

BRIEF DESCRIPTION OF THE DRAWINGS

For a better understanding of the invention, reference is made to the following detailed description of exemplary embodiments thereof, taken in conjunction with the accompanying drawing, in which.

Throughout the figures of the drawing, the same reference numerals or characters are used to denote like components, portions or features of the illustrated devices.

DETAILED DESCRIPTION

Figure 1:
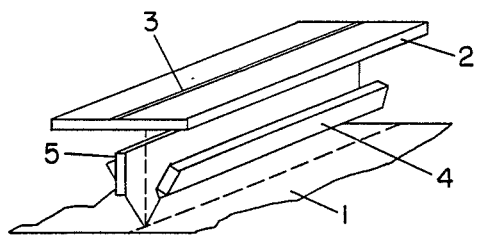
FIG. 1 is a schematic illustration of a typical image scanning arrangement used in facsimile equipment.
Figure 2:
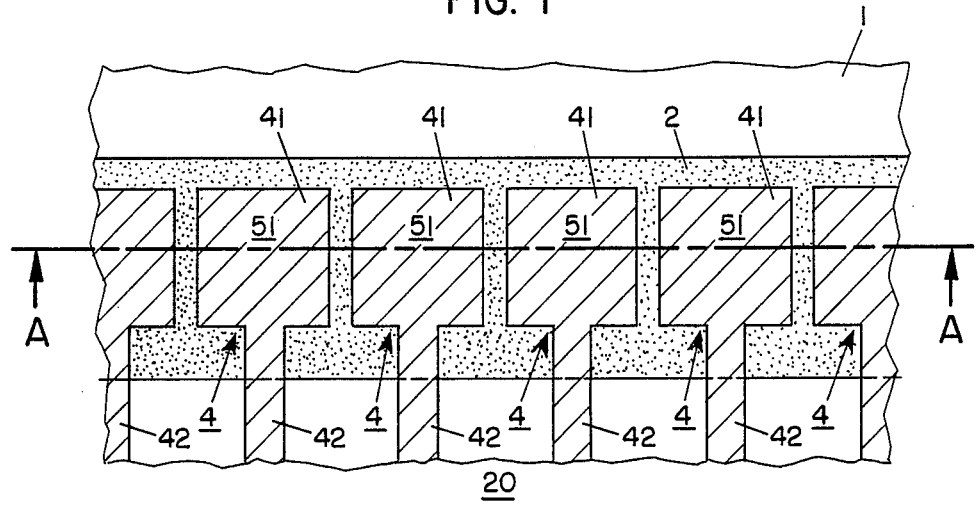
FIG. 2 is a partial plan view of a known thin-film photodiode array image sensor.
Figure 3:
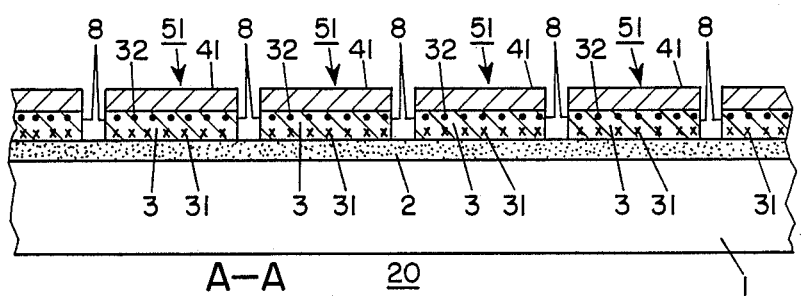
FIG. 3 is a sectional view of the image sensor of FIG. 2 taken along section line A—A of FIG. 2.
Figure 4:
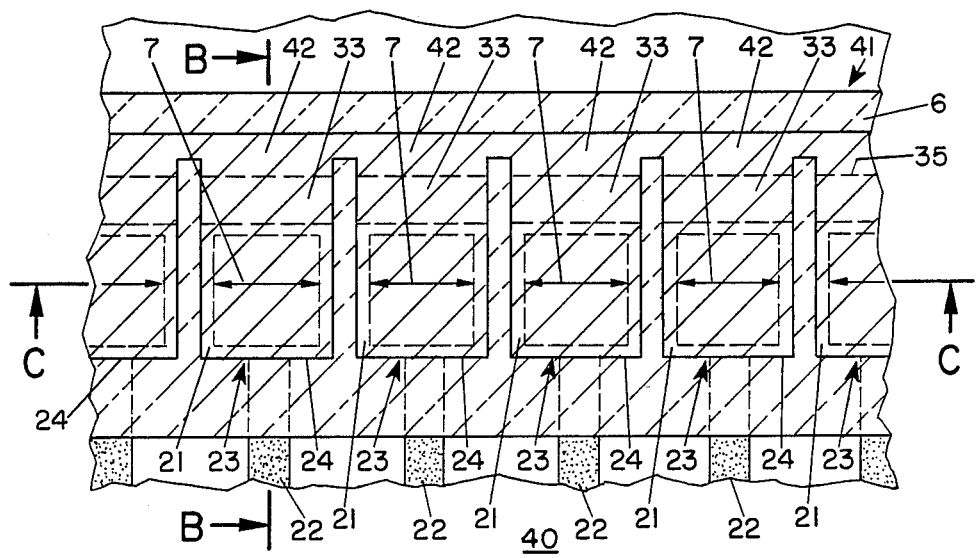
FIG. 4 is a partial plan view of a thin-film photodiode array image sensor according to an exemplary embodiment of the present invention.
Figure 5:
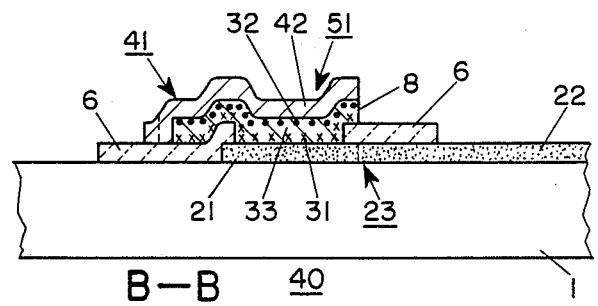
FIG. 5 is a sectional view of the image sensor of FIG. 4 taken along section line B—B of FIG. 4.
Figure 6:
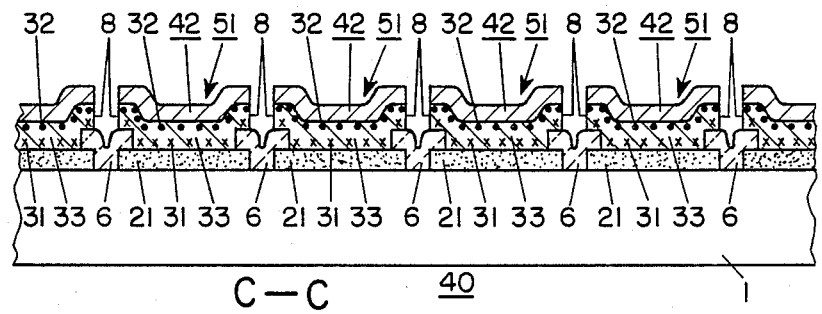
FIG. 6 is another sectional view of the image sensor of FIG. 4 taken along section line C—C of FIG. 4.

Turning now to FIGS. 4, 5 and 6, there are shown plan and sectional views of a thin-film photodiode array image sensor 40 in accordance with one embodiment of the invention. The image sensor 40 includes a layer which is divided into a plurality of separate, regularly-spaced, paddle-shaped, transparent conducting layer portions 23 formed on a major surface of a glass substrate 1. Each of the transparent conducting layer portions 23 has a square electrode region 21 having dimensions of approximately 100 $\mu$m $\times$ 100 $\mu$m or 50 $\mu$m $\times$ 50 $\mu$m, depending upon which one of the aforementioned pitches is used for the photodiodes, and a strip-like connecting region 22 extending from one side 24 of the electrode region 21. The portions 23 are formed by depositing a film of indium tin oxide to a thickness of between several hundred to several thousand angstroms by conventional electron beam evaporation, sputtering or chemical vapor deposition techniques. Following deposition, the transparent conducting film is patterned to form the separate portions 23 by conventional photolithography and etching techniques.

The image sensor 40 further includes an insulating layer 6 extending over at least the electrode regions 21 of all the transparent conducting portions 23 and having a plurality of apertures 7. Each aperture 7 frames the electrode region 21 of a respective one of the transparent conducting layer portions 23 and exposes part of the top surface thereof. The insulating layer may be a film of $SiO_2$, $Si_3H_4$ or SiC:H having a thickness on the order of several thousand angstroms. If $SiO_2$ is used, the insulating layer 6 is advantageously formed by conventional thermal chemical vapor deposition using $SiH_4$ gas diluted with $N_2$ and $O_2$. If $Si_3H_4$ is used, the insulating layer is advantageously formed by the known technique of plasma decomposition of a gaseous mixture of $NH_3$ and $SiH_4$. If SiC:H is used, the insulating layer is advantageously formed by the known technique of plasma decomposition of a gaseous mixture of $SiH_4$ and an appropriate hydrocarbon, such as $CH_2$, $C_2H_6$, $C_2H_2$, etc. Once the insulating film is deposited, the apertures 7 are formed by using conventional photolithography to form a photoresist etch mask and then etching the exposed portions of the film with a plasma generated in $CF_4$ gas.

Each of the apertures 7 is covered by a respective layer portion of amorphous silicon 33, which overlaps the edges of the aperture. Each of the amorphous silicon layer portion 33 are in turn covered by a layer of aluminum 42. The amorphous silicon layer portions 33 are formed by first depositing a film of amorphous silicon of approximately 1 $\mu$m in thickness on the substrate 1 by conventional glow discharge decomposition of $SiH_4$ gas at a relatively low temperature and pressure in a reaction chamber containing the substrate 1. The major surface of the substrate on which photodiodes are formed is covered by a metal mask such that the film that is formed has a band-like shape extending above and below the electrode regions 21 of the transparent conducting layers 23. During deposition of the amorphous silicon film, diborane gas is initially introduced into the reaction chamber for an appropriate time to create a boron doped p-type impurity layer 31 (shown as the amorphous silicon layer portions 33 after patterning of the amorphous silicon film) of approximately 100 Å in thickness adjacent the bottom surface of the film, and phosphine gas is introduced into the reaction chamber for an appropriate time at the end of the deposition to create a phosphorus doped n-type impurity layer 32 of approximately 500 Å in thickness at the top surface of the film. The portion of the amorphous silicon film between the p-type and n-type layers is undoped (i.e., intrinsic).

A film of amorphous SiC:H of approximately 100 Å in thickness deposited prior to the deposition of the amorphous silicon film may be used in place of the boron doped p-type impurity layer in the amorphous silicon film. The SiC:H film may be formed by the plasma decomposition of a gaseous mixture of $SiH_4$ and an appropriate hydrocarbon, such as $CH_2$, $C_2H_6$, $C_2H_2$, etc., in a reaction chamber containing the substrate 1.

Following the deposition of the amorphous silicon film, a layer of aluminum of approximately 1 $\mu$m in thickness is deposited over the entire substrate 1 by conventional electron beam evaporation and patterned by conventional photolithography and etching techniques to form finger-like regions 42. Each one of the finger-like regions 42 is shaped to coincide on three sides with the electrode region 21 of a respective one of the transparent conducting layer portions 23 and to overlap the upper edge 35 of the amorphous silicon film. The amorphous silicon film is then subjected to an anisotropic, high-selectivity etch in a plasma generated in $CF_4$ gas with relatively low frequency RF fields at a relatively low pressure, using the patterned aluminum layer 41 as an etch mask to form the separate amorphous silicon layers 33.

The above-described image sensor structure 40 consists of an array of p-i-n photodiodes 51 having a common aluminum cathode electrode 41 and individual transparent anode electrodes 21 with respective conductors 22 for conveying the photodetection signals from the individual photodiodes 51. The amorphous silicon layer portion 33 of each photodiode 51 has three exposed edges 8 (i.e., edges that are uncovered after the metallization and silicon etching steps) that overlie the transparent conducting layer of the photodiode. However, a respective portion of the insulating layer 6 is interposed between each such exposed edges 8 and the underlying conducting layer 23. Therefore, contamination of the side surfaces of those exposed edges 8 with conducting material during processing does not create leakage paths between the anode and cathode electrodes of the photodiodes. Consequently, by using the above-described image sensor structure according to the invention, manufacturing yield loss due to excessive leakage current is greatly reduced over that of prior art thin-film photodiode array image sensors.

Figure 7:
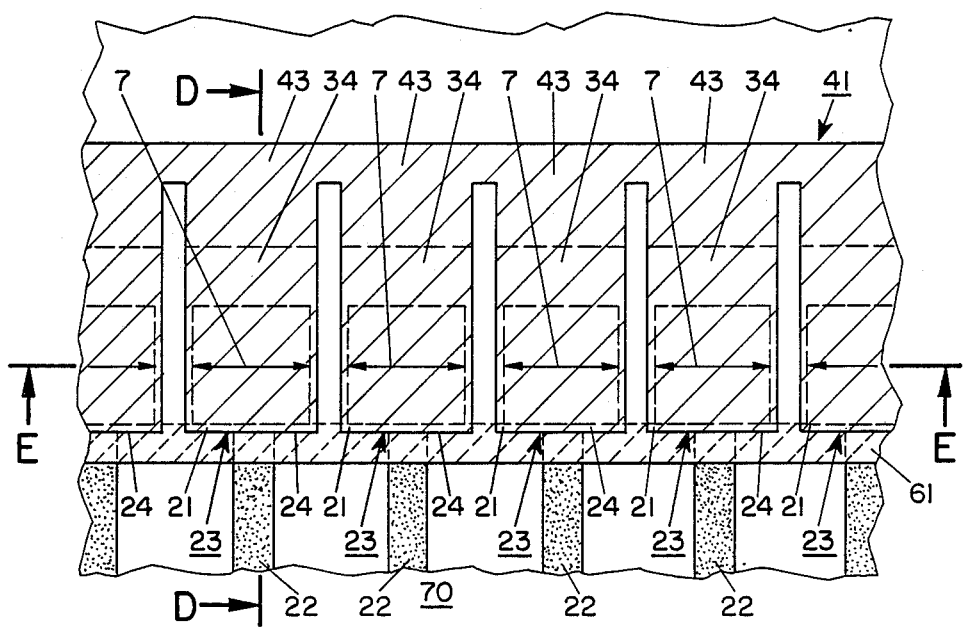
FIG. 7 is a partial plan view of a thin-film photodiode array image sensor according to another exemplary embodiment of the present invention.
Figures 8, 9:
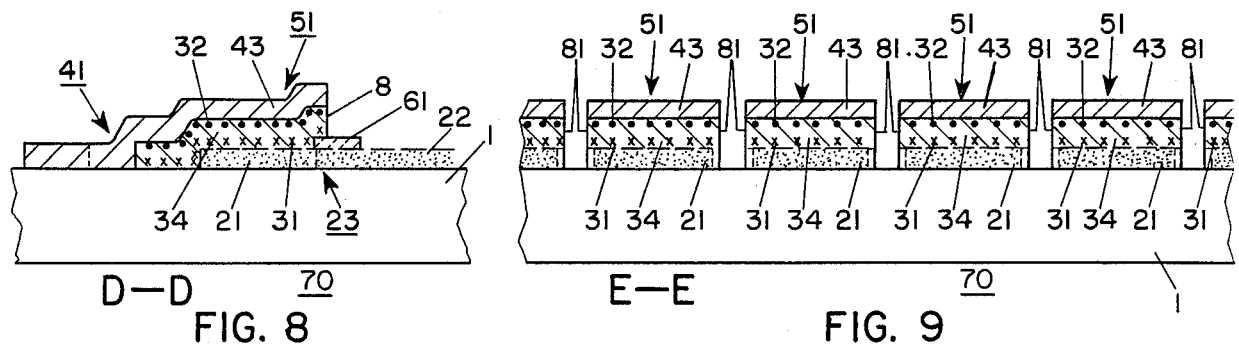
FIG. 8 is a sectional view of the image sensor of FIG. 7 taken along section line D—D of FIG. 7.
FIG. 9 is another sectional view of the image sensor of FIG. 7 taken along section line E—E of FIG. 7.

Referring now to FIGS. 7, 8 and 9, there are shown plan and sectional views of a thin-film photodiode array image sensor 70, according to another embodiment of the invention. The structure of the image sensor 70 is identical to that of FIGS. 4, 5 and 6, except for the shape of the insulating layer 61 and the sizes of the amorphous silicon layer portions 34 and the finger-like regions 42 of the aluminum layer 41. The insulating layer 61 is patterned as a strip which covers a portion of the connecting region 22 adjacent to the electrode region 21 of each of the transparent conducting layer portions 23 and which overlaps the edge of the electrode region of each of the transparent conducting layer portions 23 on the side from which the connecting region 22 extends.

The finger-like regions 43 of the aluminum layer 41 are sized to not only cover (above the intermediate amorphous silicon film) respective ones of the electrode regions 21 of the transparent conducting layer portions 23, but also to overlap the edges of the electrode regions 21. Consequently, after plasma etching of the amorphous silicon film in the manner described above in connection with the previous embodiment, the amorphous silicon layer portions 34 that are formed also overlap the edges of the electrode regions 21. As a result, each of the amorphous silicon layer portions 34 has only one exposed edge 8 that overlies the respective one of the transparent conducting layer portions 23, and the exposed edge 8 is separated from the underlying conducting layer 23 by a respective portion of the insulating layer 61. Owing to the overlap of the edges of the electrode regions by the amorphous silicon layer portions 34, the other exposed edges 81 of the amorphous silicon layer portions 34 overlie the substrate 1, and therefore the side surfaces of such exposed edges do not provide leakage paths between the anode and cathode electrodes 21 and 43, when contaminated with conducting material.

It will be understood that various modifications or alterations may be made to the foregoing exemplary embodiments by one skilled in the art without departing from the spirit and scope of the invention as defined in the appended claims. For example, the photodiode array need not be linear but may be a two-dimensional array, and other appropriate semiconductor thin-films, such as those comprising CdS, CdTe etc., may be substituted for the amorphous silicon layers used in the illustrative embodiments.

I claim:

1. A thin film photodiode array comprising a transparent insulating substrate; an plurality of transparent conducting elements disposed on a first surface of the substrate such that a portion of the substrate remains exposed surrounding each conducting element, each transparent conducting element including an electrode region and a connector region extending from one edge of the electrode region; an insulating layer of sufficient thickness for electrical isolation overlying the exposed portion of the first surface of the substrate and a peripheral portion of each conducting element and having a plurality of apertures defining an exposed portion of each electrode region; a plurality of photosensitive semiconductor elements, each semiconductor element overlying the exposed portion of a respective electrode region and overlapping the edges of a respective aperture in the overlying insulating layer; and a conductive layer overlying the semiconductor elements and extending to the edges of the transparent conducting elements.

2. An array in accordance with claim 1, in which the photosensitive semiconductor elements have a p-i-n structure.

3. An array in accordance with claim 2 in which the photosensitive semiconductor elements are of amorphous silicon.

4. An array in accordance with claim 3 in which said transparent conducting elements are of indium-doped tin oxide, said conductive layer is of aluminum, and said insulating layer is a silicon compound.

5. An array in accordance with claim 1 in which the electrode regions are aligned to form a spaced linear array.

6. An array in accordance with claim 5 in which each electrode region is substantially squareshaped and the connector regions form a spaced linear array.

7. A thin film photodiode array comprising a transparent insulating substrate; a plurality of transparent conducting elements disposed on a first surface of the substrate such that a portion of the substrate remains exposed surrounding each conducting element, each transparent conducting element including an electrode region and a connector region extending from one edge of the electrode region; an insulating layer of sufficient thickness for electrical isolation overlying at least the one edge of each electrode region from which the connector region extends; a plurality of photosensitive semiconductor elements, each semiconductor element overlying a respective electrode region, overlapping the insulating layer on at least one edge, and overlapping the edges of the electrode region not overlapped by the insulating layer; and a conductive layer overlying the semiconductor elements.

8. The array of claim 7 in which the semiconductor elements have a p-i-n structure.

9. The array of claim 8 in which the semiconductor elements are amorphous silicon, the transparent conducting elements are of indium-doped tin oxide, and the insulating layer is a silicon compound.

* * * * *

UNITED STATES PATENT AND TRADEMARK OFFICE
CERTIFICATE OF CORRECTION

PATENT NO. : 4,868,623

DATED : September 19, 1989

INVENTOR(S) : Masaharu Nishiura

It is certified that error appears in the above-identified patent and that said Letters Patent is hereby corrected as shown below:

Column 1, line 4, "Nov. 16" should read --Nov. 26--;

Column 5, line 16, "Åin" should read --Å in--;

Column 5, line 20, "Åin" should read --Å in--;

Column 6, line 48, "an" should read --a--.

Signed and Sealed this

Eleventh Day of December, 1990

Attest:

HARRY F. MANBECK, JR.

Attesting Officer

Commissioner of Patents and Trademarks